United States Patent
Shih

(10) Patent No.: US 10,283,362 B2
(45) Date of Patent: May 7, 2019

(54) METHOD OF FORMING FINE LINE PATTERNS OF SEMICONDUCTOR DEVICES

(71) Applicant: NANYA TECHNOLOGY CORPORATION, New Taipei (TW)

(72) Inventor: Shing-Yih Shih, New Taipei (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 1 day.

(21) Appl. No.: 15/680,186

(22) Filed: Aug. 17, 2017

(65) Prior Publication Data
US 2019/0057871 A1 Feb. 21, 2019

(51) Int. Cl.
*H01L 21/311* (2006.01)
*H01L 21/033* (2006.01)
*H01L 21/02* (2006.01)

(52) U.S. Cl.
CPC .... *H01L 21/0338* (2013.01); *H01L 21/02282* (2013.01); *H01L 21/0332* (2013.01); *H01L 21/0335* (2013.01); *H01L 21/0337* (2013.01); *H01L 21/31116* (2013.01); *H01L 21/31144* (2013.01)

(58) Field of Classification Search
CPC ........... H01L 21/02282; H01L 21/0332; H01L 21/0335; H01L 21/0337; H01L 21/0338; H01L 21/31116; H01L 21/31144
USPC .......................................................... 438/702
See application file for complete search history.

(56) References Cited

U.S. PATENT DOCUMENTS

| | | | |
|---|---|---|---|
| 5,328,810 A | 7/1994 | Lowrey et al. | |
| 2008/0090419 A1* | 4/2008 | Koh | H01L 21/0337 438/696 |
| 2011/0034004 A1* | 2/2011 | Jang | H01L 21/3086 438/424 |
| 2014/0097520 A1* | 4/2014 | Millward | H01L 21/76816 257/622 |
| 2016/0254153 A1 | 9/2016 | Park et al. | |
| 2016/0266494 A1 | 9/2016 | Kim et al. | |
| 2016/0372334 A1* | 12/2016 | Mignot | H01L 21/31116 |

* cited by examiner

*Primary Examiner* — Brook Kebede
(74) *Attorney, Agent, or Firm* — CKC & Partners Co., LLC

(57) ABSTRACT

A method of forming fine line patterns of semiconductor devices includes: forming a plurality of lower linear core structures on at least one lower hard mask layer disposed on a target layer; forming a spacer layer on the hard mask layer to cover the lower linear core structures; forming an upper hard mask layer on the spacer layer; thinning the upper hard mask layer to expose potions of the spacer layer; and removing the exposed portions of the spacer layer to form a plurality of line patterns on the lower hard mask layer.

14 Claims, 9 Drawing Sheets

METHOD OF FORMING FINE LINE PATTERNS OF SEMICONDUCTOR DEVICES

BACKGROUND

Technical Field

The present disclosure relates to a method of forming fine line patterns of semiconductor devices.

Description of Related Art

As the degree of integration of semiconductor devices increases, various double patterning technologies for forming fine line patterns having a pitch or a diameter smaller than the minimum resolution of a photolithography process have been developed.

In general, there are two major double patterning techniques (DPT): Litho-Etch-Litho-Etch (LELE) Double Patterning technique and Self-Aligned Double Patterning (SADP) technique. LELE is much more mature than SADP in terms of process development and design flow implementation, while SADP has stronger scaling potential than LELE due to its smaller design rules on tip-tip and tip-side as well as its intrinsic self-align property.

SUMMARY

An aspect of the disclosure is to provide a method of forming fine line patterns of semiconductor devices.

According to an embodiment of the disclosure, the method of forming fine line patterns includes: forming a plurality of lower linear core structures on at least one lower hard mask layer disposed on a target layer; forming a spacer layer on the lower hard mask layer to cover the lower linear core structures; forming an upper hard mask layer on the spacer layer; thinning the upper hard mask layer until potions of the spacer layer are exposed; and removing the exposed portions of the spacer layer to form a plurality of line patterns on the lower hard mask layer.

In an embodiment of the disclosure, the forming the lower linear core structures includes: forming at least one buffer hard mask layer on the lower hard mask layer; forming a plurality of upper linear core structures on the buffer hard mask layer; etching portions of the buffer hard mask layer exposed by the upper linear core structures until portions of the lower hard mask layer are exposed; and removing remaining portions of the upper linear core structures, in which remaining portions of the buffer hard mask layer serve as the lower linear core structures.

In an embodiment of the disclosure, the forming the upper linear core structures includes equidistantly forming the upper linear core structures on the buffer hard mask layer, in which a line width of the upper linear core structures is substantially equal to a half of a line pitch of the upper linear core structures.

In an embodiment of the disclosure, the method further includes trimming the upper linear core structures before the etching the portions of the buffer hard mask layer, in which a line width of the trimmed upper linear core structures is smaller than a half of the line pitch.

In an embodiment of the disclosure, the forming the spacer layer forms a plurality of linear islands respectively covering the lower linear core structures. The forming the upper hard mask layer includes filling up a space formed between any adjacent two of the linear islands with the upper hard mask layer.

In an embodiment of the disclosure, the forming the upper hard mask layer is performed by spin-coating.

In an embodiment of the disclosure, the thinning the upper hard mask layer is performed by an etch back process.

In an embodiment of the disclosure, a line width of the line patterns is greater than a thickness of the spacer layer.

In an embodiment of the disclosure, the thickness of the spacer layer is greater than one third of the line width of the line patterns.

In an embodiment of the disclosure, the method further includes etching the lower hard mask layer using the line patterns as a mask.

In an embodiment of the disclosure, the etching the lower hard mask layer is performed until portions of the target layer are etched.

In an embodiment of the disclosure, the method further includes removing remaining portions of the lower hard mask layer after the etching the lower hard mask layer.

In an embodiment of the disclosure, the method further includes removing remaining portions of the line patterns after the etching the lower hard mask layer.

In an embodiment of the disclosure, the thinning the upper hard mask layer and the removing the exposed portions of the spacer layer are performed by a dry etching process.

Accordingly, the method of forming fine line patterns of semiconductor devices of the disclosure can effectively form fine line patterns with narrow space smaller than minimum resolution of a photolithography process.

It is to be understood that both the foregoing general description and the following detailed description are by examples, and are intended to provide further explanation of the disclosure as claimed.

BRIEF DESCRIPTION OF THE DRAWINGS

The disclosure can be more fully understood by reading the following detailed description of the embodiment, with reference made to the accompanying drawings as follows.

DETAILED DESCRIPTION

Figure 1A:
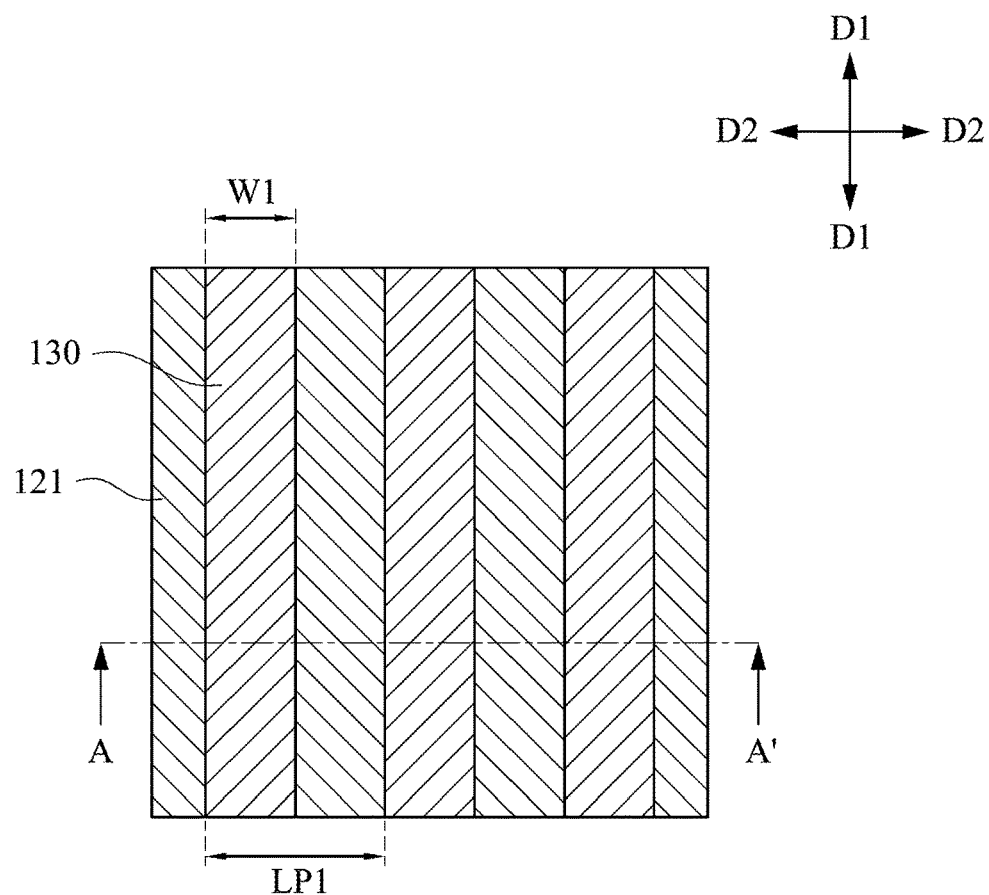
FIGS. 1A, 2A, 3A, 4A, 5A, 6A, 7A, 8A and 9A are top views illustrating a method of forming fine line patterns of semiconductor devices according to some embodiments of the disclosure.

Reference will now be made in detail to the present embodiments of the disclosure, examples of which are illustrated in the accompanying drawings. Wherever possible, the same reference numbers are used in the drawings and the description to refer to the same or like parts. However, specific structural and functional details disclosed herein are merely representative for purposes of describing example embodiments, and thus may be embodied in many alternate forms and should not be construed as limited to only example embodiments set forth herein. Therefore, it should be understood that there is no intent to limit example embodiments to the particular forms disclosed, but on the contrary, example embodiments are to cover all modifications, equivalents, and alternatives falling within the scope of the disclosure.

In the drawings, the thicknesses of layers and regions may be exaggerated for clarity, and like numbers refer to like elements throughout the description of the figures.

Although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments.

It will be understood that, if an element is referred to as being "connected" or "coupled" to another element, it can be directly connected, or coupled, to the other element or intervening elements may be present. Other words used to describe the relationship between elements should be interpreted in a like fashion (e.g., "between" versus "directly between," "adjacent" versus "directly adjacent," etc.).

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," if used herein, specify the presence of stated features, integers, steps, operations, elements and/or components, but do not preclude the presence or addition of one or more other features, integers, steps, operations, elements, components and/or groups thereof.

Spatially relative terms (e.g., "beneath," "below," "lower," "above," "upper" and the like) may be used herein for ease of description to describe one element or a relationship between a feature and another element or feature as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, for example, the term "below" can encompass both an orientation that is above, as well as, below. The device may be otherwise oriented (rotated 90 degrees or viewed or referenced at other orientations) and the spatially relative descriptors used herein should be interpreted accordingly.

Example embodiments are described herein with reference to cross-sectional illustrations that are schematic illustrations of idealized embodiments (and intermediate structures). As such, variations from the shapes of the illustrations as a result, for example, of manufacturing techniques and/or tolerances, may be expected. Thus, example embodiments should not be construed as limited to the particular shapes of regions illustrated herein but may include deviations in shapes that result, for example, from manufacturing.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Example embodiments of the disclosure provide a method of forming fine line patterns of semiconductor devices.

Figure 1B:
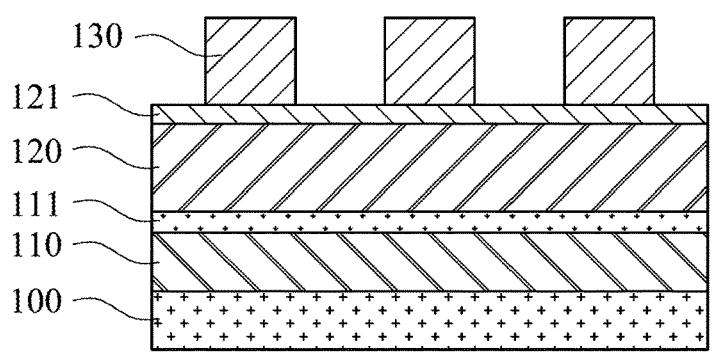
FIGS. 1B, 2B, 3B, 4B, 5B, 6B, 7B, 8B and 9B are longitudinal cross-sectional views taken along line A-A' of FIGS. 1A, 2A, 3A, 4A, 5A, 6A, 7A, 8A and 9A, respectively.

Reference is made to FIGS. 1A and 1B. In some embodiments, the method of forming fine line patterns may include: sequentially forming a first lower hard mask layer 110, a second lower hard mask layer 111, a first buffer hard mask layer 120, and a second buffer hard mask layer 121 on a target layer 100; and forming a plurality of upper linear core structures 130 on the second buffer hard mask layer 121. In some embodiments, at least one of the second lower hard mask layer 111 and the second buffer hard mask layer 121 can be omitted.

In some embodiments, the first lower hard mask layer 110 may include silicon (Si), silicon dioxide ($SiO_2$), silicon nitride (SiN), silicon oxynitride (SiON), etc. In some embodiments, the second lower hard mask layer 111 120 may include Si, $SiO_2$, SiN, SiON, silicon carbide (SiC), etc.

In some embodiments, the first buffer hard mask layer 120 may include SiON, SiO (silicon monoxide), SiN, an organic material, etc. In some embodiments, the second buffer hard mask layer 121 may include SiON, SiO, SiN, an organic material, etc.

In some embodiments, the forming the upper linear core structures 130 may include: forming a photoresist layer (not shown) on the second buffer hard mask layer 121; and performing a photolithography process to the photoresist layer to form the upper linear core structures 130.

In some embodiments, the upper linear core structures 130 are extended along a first direction D1 and arranged along a second direction D2 (referring to FIG. 1A). In some embodiments, the first direction D1 is perpendicular to the second direction D2, but the disclosure is not limited in this regard.

In some embodiments, the forming the upper linear core structures 130 includes equidistantly forming the upper linear core structures 130 on the second buffer hard mask layer 121, in which a line width W1 of the upper linear core structures 130 is substantially equal to a half of a line pitch LP1 of the upper linear core structures 130. For example, the line pitch LP1 of the upper linear core structures 130 may be in a range from 100 nm to 120 nm, and the line width W1 of the upper linear core structures 130 may be in a range from 50 nm to 60 nm. In some embodiments, the line pitch LP1 of the upper linear core structures 130 is equal to the minimum line pitch which can be formed by photolithography equipment.

Figure 2A:
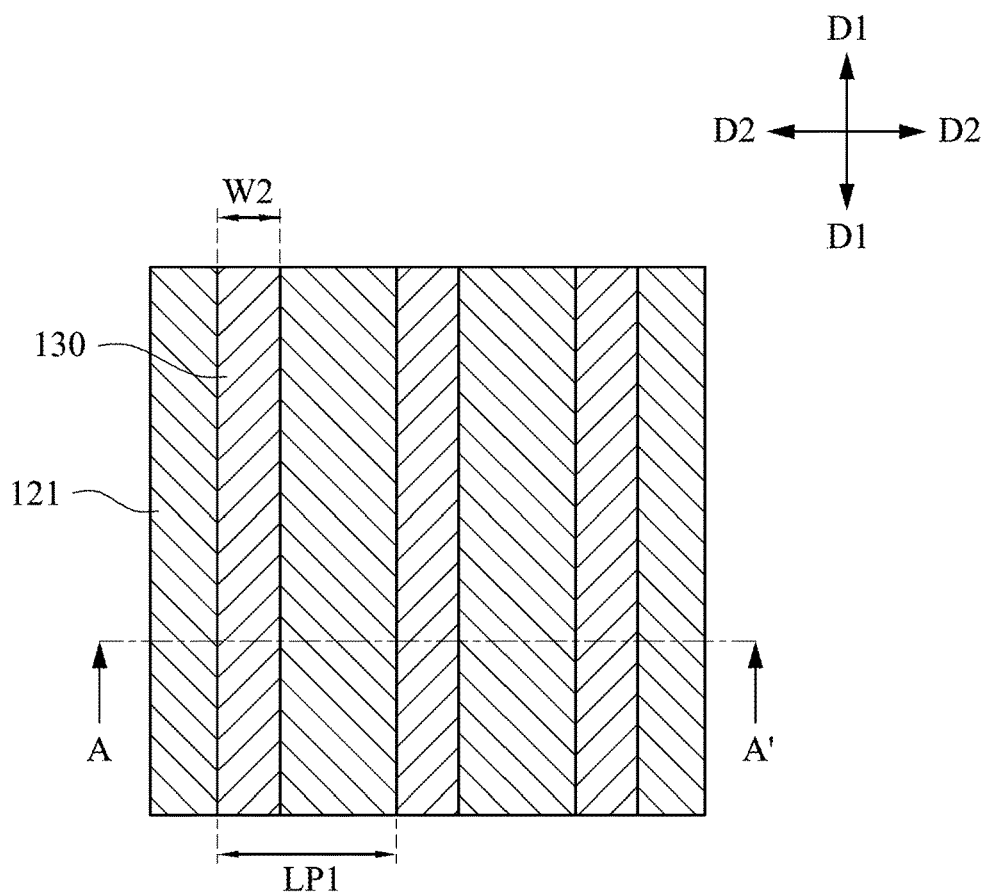
Figure 2B:
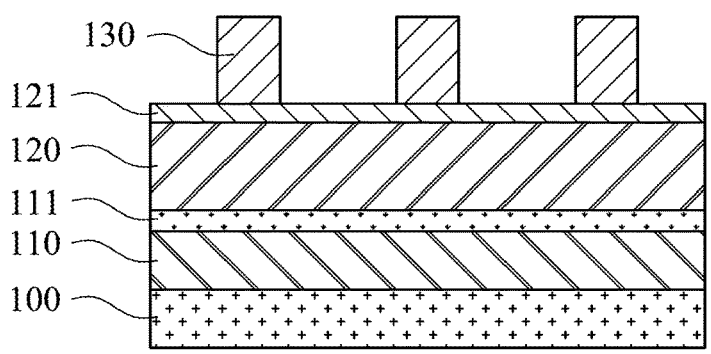

Reference is made to FIGS. 2A and 2B. In some embodiments, the method of forming fine line patterns may further include trimming the upper linear core structures 130, in which a line width W2 of the trimmed upper linear core structures 130 is smaller than a half of the line pitch LP1. In some embodiments, the line width W2 of the trimmed upper linear core structures 130 may be equal to or greater than a quarter of the line pitch LP1. For example, the line pitch LP1 of the upper linear core structures 130 may be in a range from 100 nm to 120 nm, and the line width W2 of the trimmed upper linear core structures 130 130 may be in a range from 40 nm to 50 nm.

Figure 3A:
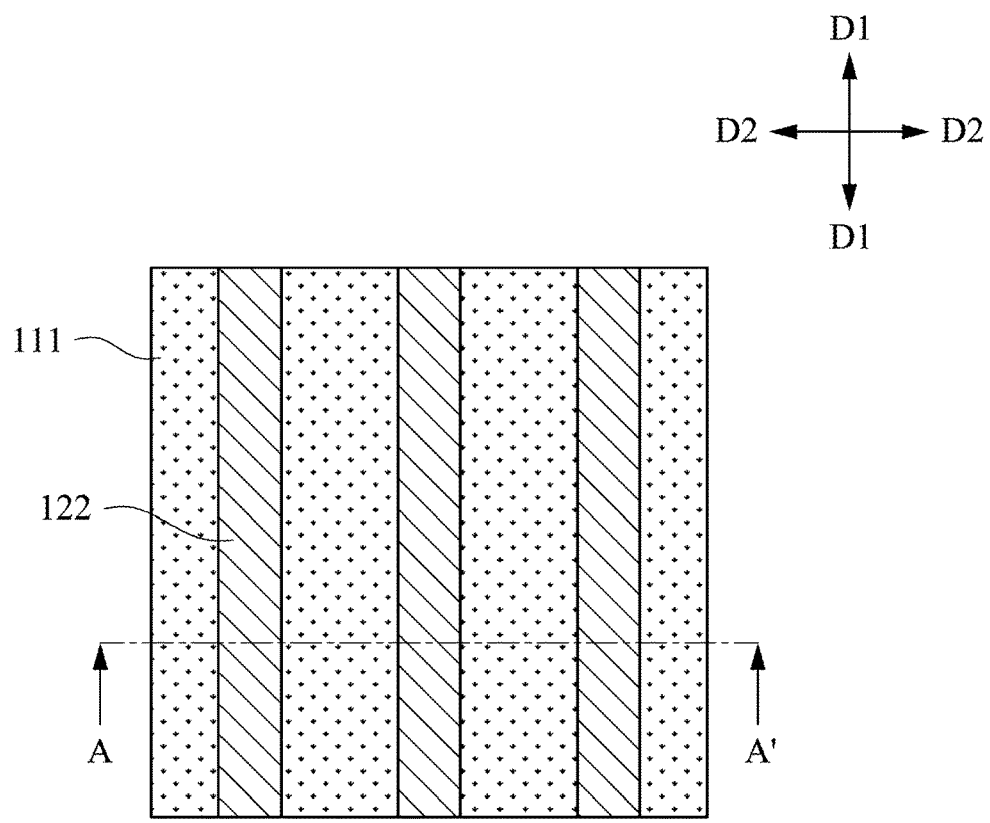
Figure 3B:
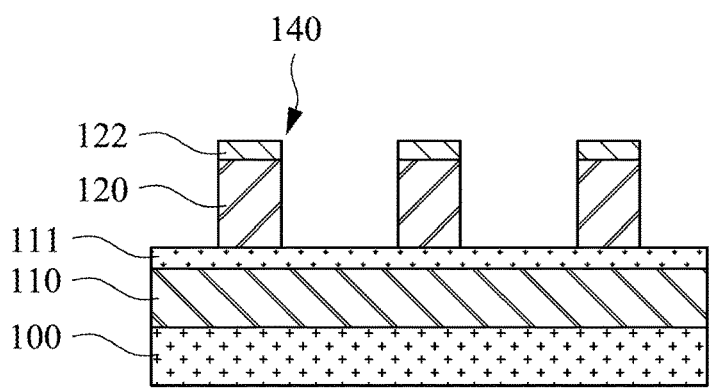

Reference is made to FIGS. 3A and 3B. In some embodiments, the method of forming fine line patterns may further include: etching portions of the second buffer hard mask layer 121 exposed by the upper linear core structures 130 until portions of the second lower hard mask layer 111 are exposed; and removing remaining portions of the upper linear core structures 130, in which remaining portions of the first buffer hard mask layer 120 and remaining portions of the second buffer hard mask layer 121 form a plurality of lower linear core structures 140. In some embodiments, lower linear core structures 140 are only formed by the remaining portions of the first buffer hard mask layer 120. In some embodiments, the second lower hard mask layer 111 may be omitted, and the method of forming fine line patterns may alternatively include etching the portions of the second buffer hard mask layer 121 exposed by the upper linear core structures 130 until portions of the first lower hard mask layer 110 are exposed.

Figure 4A:
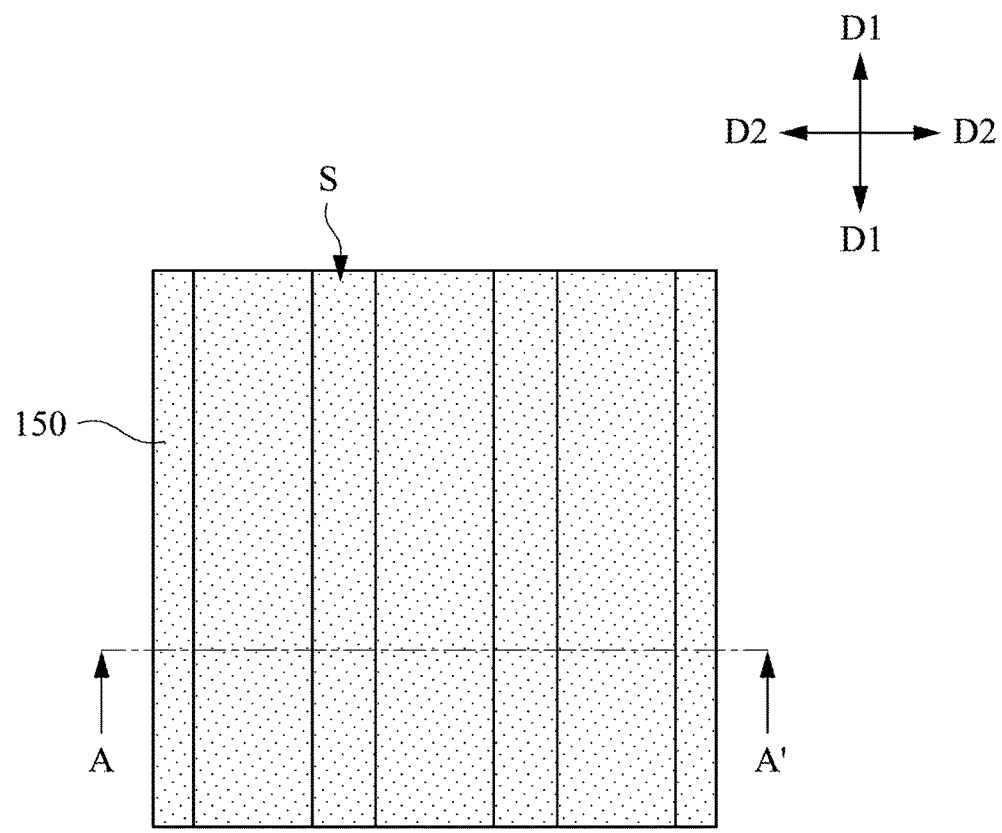
Figure 4B:
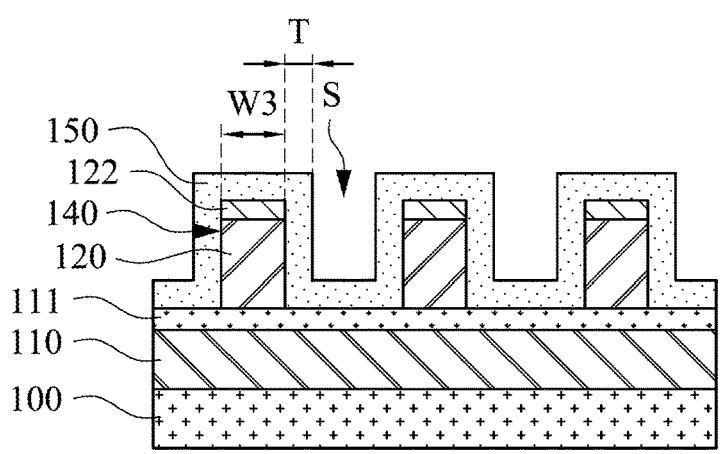

Reference is made to FIGS. 4A and 4B. In some embodiments, the method of forming fine line patterns may further include forming a spacer layer 150 on the second lower hard mask layer 111 to cover the lower linear core structures 140. In some embodiments, a line width W3 of the lower linear core structures 140 is greater than a thickness T of the spacer layer 150. In some embodiments, the thickness T of the spacer layer 150 is greater than one third of the line width W3 of the lower linear core structures 140. In some embodiments, the second lower hard mask layer 111 may be omitted, and the method of forming fine line patterns may alternatively include forming the spacer layer 150 on the first lower hard mask layer 110 to cover the lower linear core structures 140.

In some embodiments, the forming the spacer layer 150 may include blanket forming the spacer layer 150 by Atomic layer deposition (ALD). In some embodiments, the spacer layer 150 may include SiN, SiO, etc.

Figure 5A:
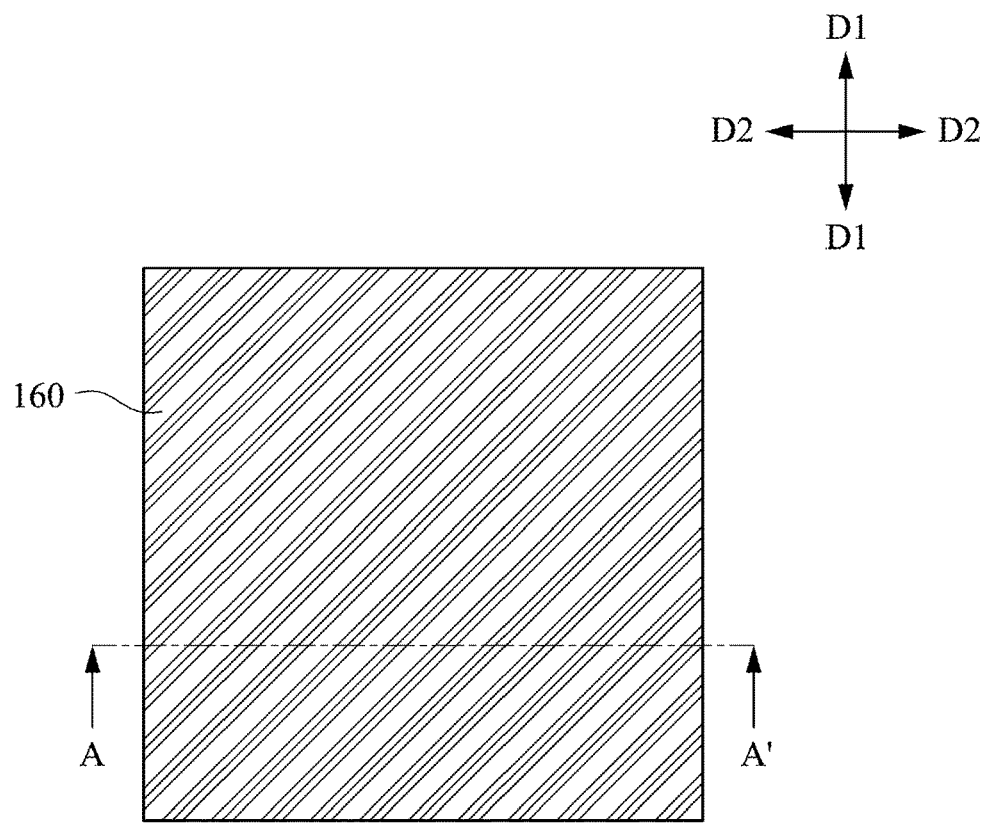
Figure 5B:
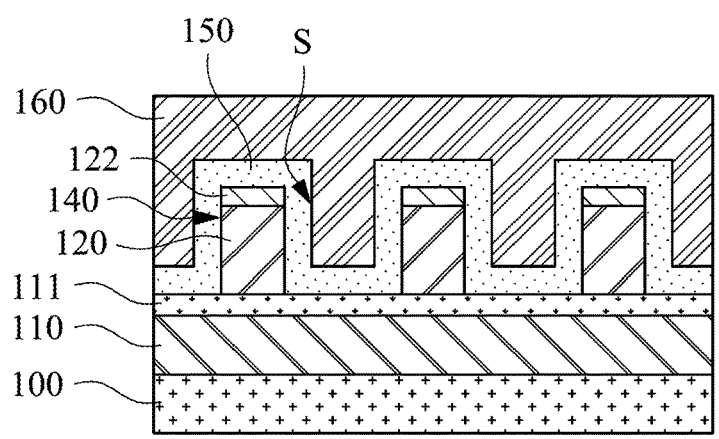

Reference is made to FIGS. 5A and 5B. In some embodiments, the method of forming fine line patterns may further include forming an upper hard mask layer 160 on the spacer layer 150. In some embodiments, the forming the spacer layer 150 forms a plurality of linear islands (referring to FIG. 4B) respectively covering the lower linear core structures 140, and the forming the upper hard mask layer 160 may include filling up a space S formed between any adjacent two of the linear islands with the upper hard mask layer 160.

In some embodiments, the forming the upper hard mask layer 160 is performed by spin-coating, so as to filling up the space S formed between any adjacent two of the linear islands.

In some embodiments, the upper hard mask layer 160 may include SiON, SiO, SiN, a carbon-containing organic material, a silicon-containing organic material, etc.

Figure 6A:
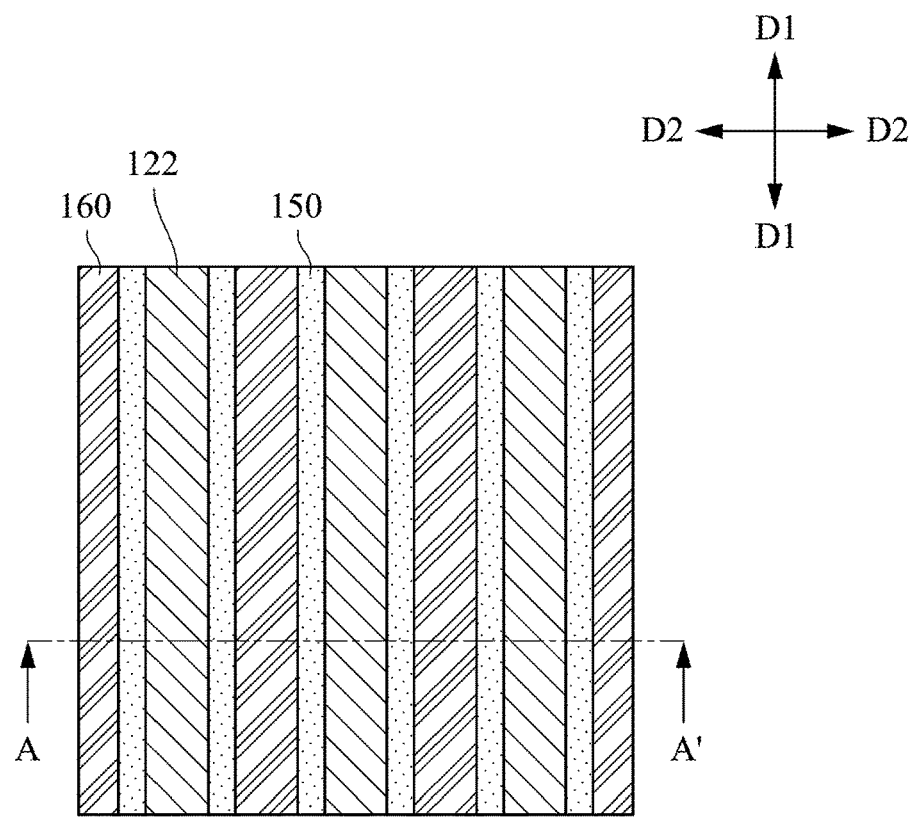
Figure 6B:
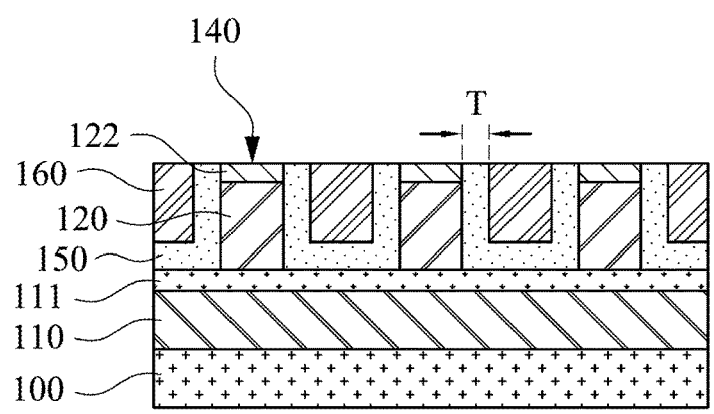

Reference is made to FIGS. 6A and 6B. In some embodiments, the method of forming fine line patterns may further include thinning the upper hard mask layer 160 until potions of the spacer layer 150 are exposed. In some embodiments, the thinning the upper hard mask layer 160 is performed by an etch back process.

Figure 7A:
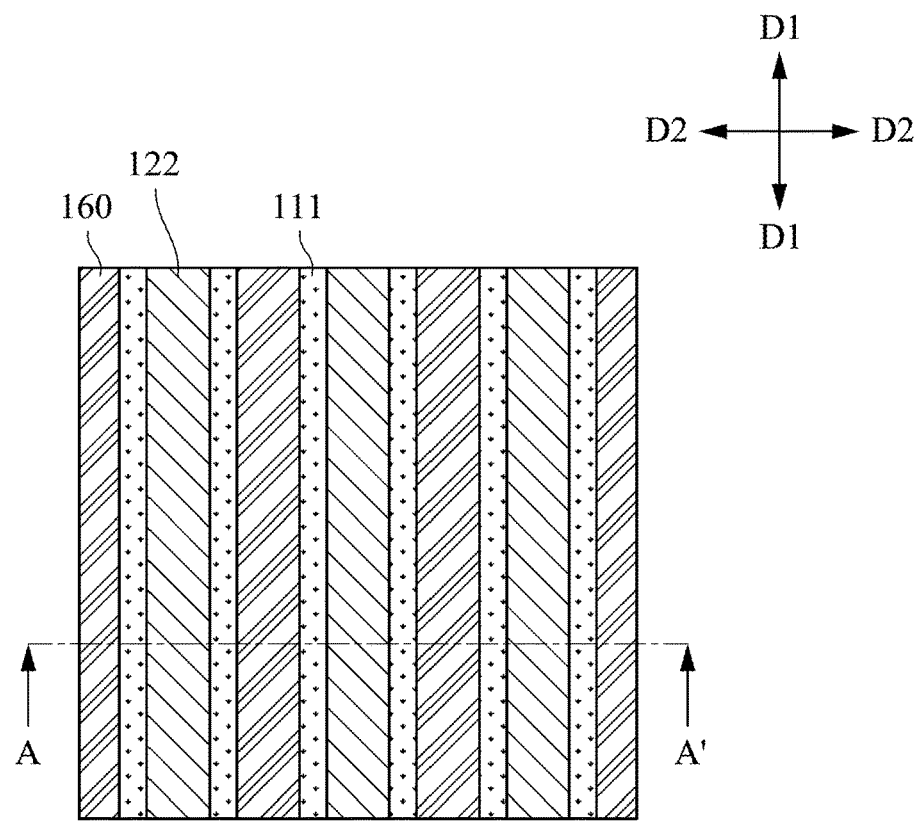
Figure 7B:
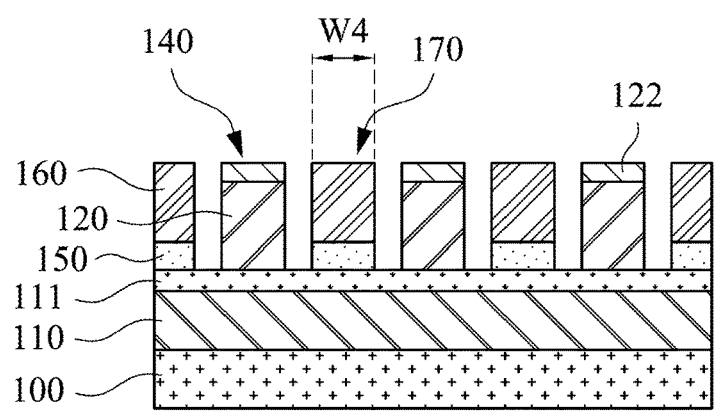

Reference is made to FIGS. 7A and 7B. In some embodiments, the method of forming fine line patterns may further include removing the exposed portions of the spacer layer 150 to form a plurality of line patterns 170 on the second lower hard mask layer 111. It should be pointed out that some of the line patterns 170 are constituted by the lower linear core structures 140, and the others of the line patterns 170 are constituted by remaining portions of the spacer layer 150 and the upper hard mask layer 160 after the removing the exposed portions of the spacer layer 150. As a result, the fine line patterns formed by the various embodiments of the disclosure may have narrow space (i.e., the thickness T) through multiple deposition/etching processes for upper linear core structures 130 having a minimum line pitch which can be formed by photolithography equipment.

In some embodiments, a line width W4 of the line patterns 170 is greater than a thickness T of the spacer layer 150 (referring to FIGS. 6B and 7B). In some embodiments, the thickness T of the spacer layer 150 is greater than one third of the line width W4 of the line patterns 170. In some embodiments, the second lower hard mask layer 111 may be omitted, and the method of forming fine line patterns may alternatively include removing the exposed portions of the spacer layer 150 to form the line patterns 170 on the first lower hard mask layer 110.

In some embodiments, the thinning the upper hard mask layer 160 (referring to FIGS. 6A and 6B) and the removing the exposed portions of the spacer layer 150 (referring to FIGS. 7A and 7B) may be performed by a dry etching process. In some embodiments, the thinning the upper hard mask layer 160 may be performed by a dry etching process, and the removing the exposed portions of the spacer layer 150 may be performed by a wet etching process.

Figure 8A:
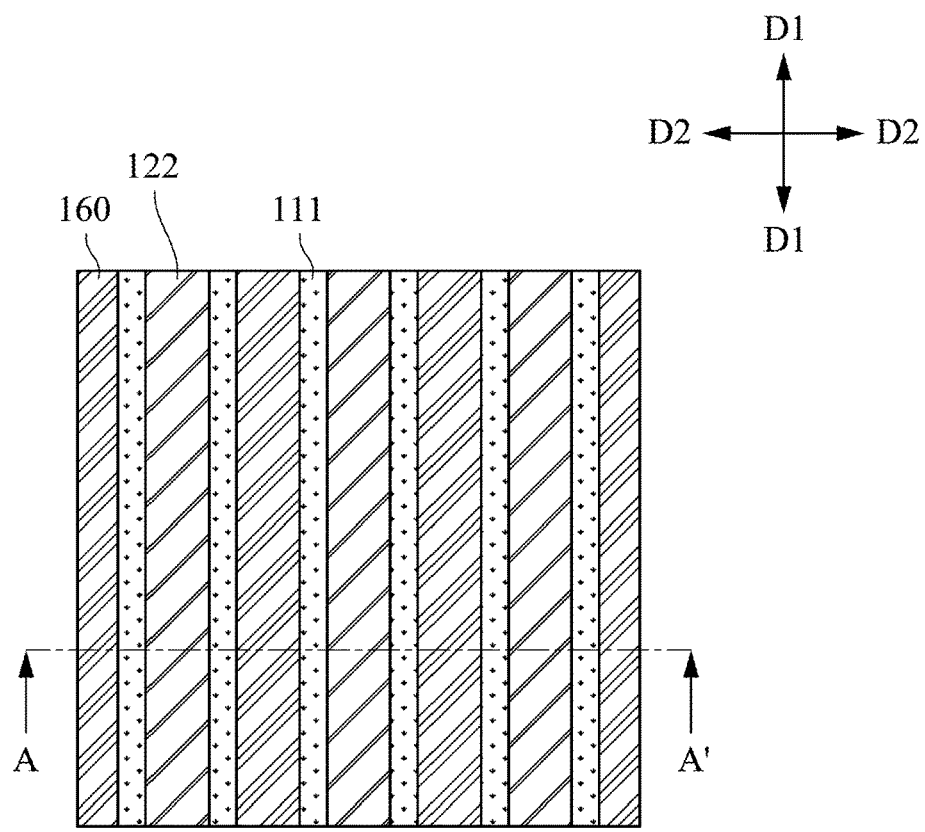
Figure 8B:
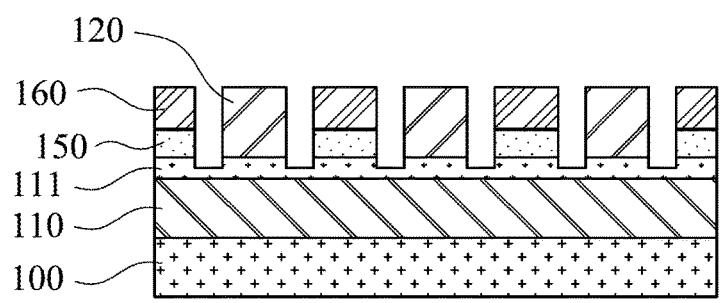

Reference is made to FIGS. 8A and 8B. In some embodiments, the method of forming fine line patterns may further include etching the second lower hard mask layer 111 using the line patterns 170 as a mask. In some embodiments, the method of forming fine line patterns may further include removing remaining portions of the line patterns 170 after the etching the second lower hard mask layer 111. As a result, patterns of the line patterns 170 can be transferred into the second lower hard mask layer 111.

In some embodiments, the second lower hard mask layer 111 may be omitted, and the method of forming fine line patterns may alternatively include etching the first lower hard mask layer 110 using the line patterns 170 as the mask. As a result, the patterns of the line patterns 170 can be transferred into the first lower hard mask layer 110.

Figure 9A:
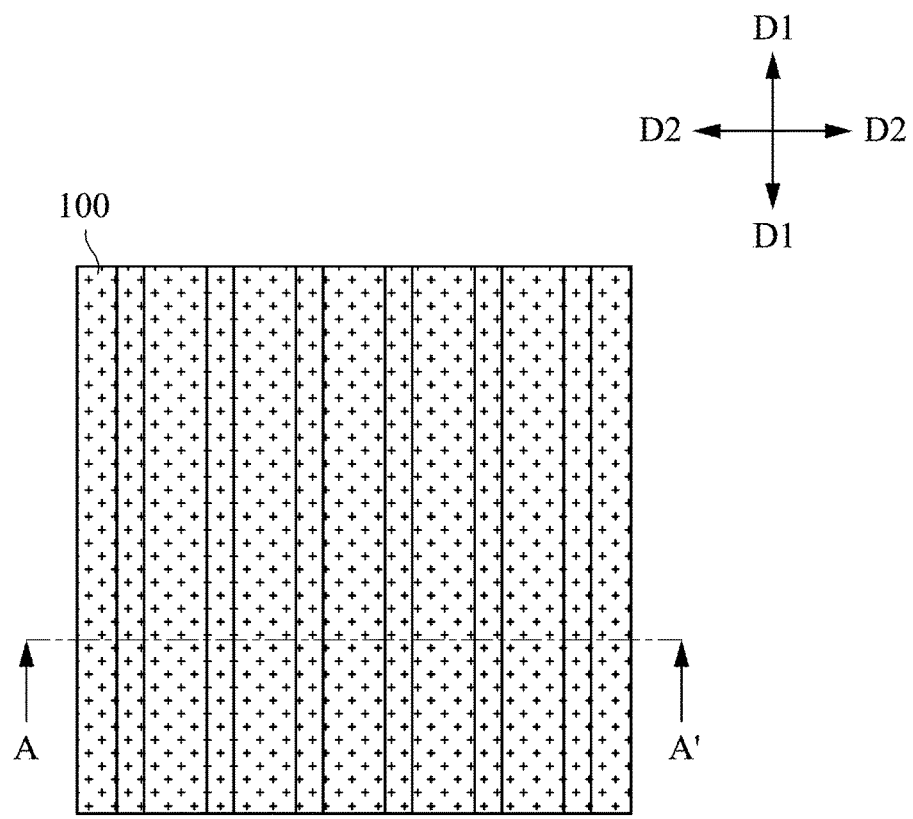
Figure 9B:
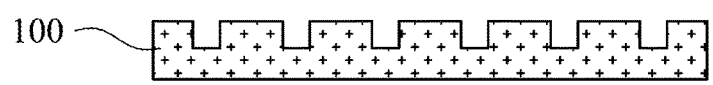

Reference is made to FIGS. 9A and 9B. In some embodiments, the etching the second lower hard mask layer 111 may be performed until portions of the target layer 100 are etched, and the method of forming fine line patterns may further include removing remaining portions of the second lower hard mask layer 111 and remaining portions of the first lower hard mask layer 110 after the etching the second lower hard mask layer 111. As a result, the patterns of the line patterns 170 can be transferred into the target layer 100.

According to the foregoing recitations of the embodiments of the disclosure, it can be seen that the fine line patterns formed by the various embodiments of the disclosure may have narrow space through multiple deposition/etching processes for linear core structures having a minimum line pitch which can be formed by photolithography equipment. Therefore, degree of integration of the semiconductor devices may be improved and the fine line patterns may be stably formed by simple processes since advanced photolithography processes for forming fine line patterns may not be excessively used. In other words, the methods of forming fine line patterns of semiconductor devices according to various embodiments may provide formation of high density line patterns using one photolithography process and deposition and etch back processes of well-known materials without using high-priced semiconductor fabrication equipments, processes, and materials.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims.

What is claimed is:

1. A method of forming fine line patterns, the method comprising:
    forming a plurality of lower linear core structures on at least one lower hard mask layer disposed on a target layer;
    forming a spacer layer on the lower hard mask layer to cover the lower linear core structures;
    forming an upper hard mask layer on the spacer layer;
    thinning the upper hard mask layer until potions of the spacer layer are exposed; and
    removing the exposed portions of the spacer layer until potions of the lower hard mask layer are exposed, so as to form a plurality of line patterns on the lower hard mask layer.

2. The method of claim 1, wherein the forming the lower linear core structures comprises:
    forming at least one buffer hard mask layer on the lower hard mask layer;
    forming a plurality of upper linear core structures on the buffer hard mask layer;
    etching portions of the buffer hard mask layer exposed by the upper linear core structures until portions of the lower hard mask layer are exposed; and
    removing remaining portions of the upper linear core structures, wherein remaining portions of the buffer hard mask layer serve as the lower linear core structures.

3. The method of claim 2, wherein the forming the upper linear core structures comprises:
    equidistantly forming the upper linear core structures on the buffer hard mask layer, wherein a line width of the upper linear core structures is substantially equal to a half of a line pitch of the upper linear core structures.

4. The method of claim 3, further comprising:
    trimming the upper linear core structures before the etching the portions of the buffer hard mask layer, wherein a line width of the trimmed upper linear core structures is smaller than a half of the line pitch.

5. The method of claim 1, wherein the forming the spacer layer forms a plurality of linear islands respectively covering the lower linear core structures, and the forming the upper hard mask layer comprises:
    filling up a space formed between any adjacent two of the linear islands with the upper hard mask layer.

6. The method of claim 1, wherein the forming the upper hard mask layer is performed by spin-coating.

7. The method of claim 1, wherein the thinning the upper hard mask layer is performed by an etch back process.

8. The method of claim 1, wherein a line width of the line patterns is greater than a thickness of the spacer layer.

9. The method of claim 8, wherein the thickness of the spacer layer is greater than one third of the line width of the line patterns.

10. The method of claim 1, further comprising:
    etching the lower hard mask layer using the line patterns as a mask.

11. The method of claim 10, wherein the etching the lower hard mask layer is performed until portions of the target layer are etched.

12. The method of claim 11, further comprising:
    removing remaining portions of the lower hard mask layer after the etching the lower hard mask layer.

13. The method of claim 10, further comprising:
    removing remaining portions of the line patterns after the etching the lower hard mask layer.

14. The method of claim 1, wherein the thinning the upper hard mask layer and the removing the exposed portions of the spacer layer are performed by a dry etching process.

* * * * *